(12) United States Patent
Nakatani

(10) Patent No.: US 8,359,928 B2
(45) Date of Patent: Jan. 29, 2013

(54) PRESSURE SENSOR AND METHOD FOR MANUFACTURING THE PRESSURE SENSOR

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 35 days.

(21) Appl. No.: 13/045,511

(22) Filed: Mar. 10, 2011

(65) Prior Publication Data

US 2011/0221014 A1 Sep. 15, 2011

(30) Foreign Application Priority Data

Mar. 11, 2010 (JP) ................................. 2010-054496

(51) Int. Cl.
*G01L 9/00* (2006.01)
*G01L 9/04* (2006.01)
*B23P 17/04* (2006.01)

(52) U.S. Cl. ................. 73/754; 73/720; 73/726; 29/592

(58) Field of Classification Search .......................... None
See application file for complete search history.

(56) References Cited

U.S. PATENT DOCUMENTS

| | | | | |
|---|---|---|---|---|
| 6,051,853 | A | * | 4/2000 | Shimada et al. ............... 257/252 |
| 2004/0177699 | A1 | * | 9/2004 | Katsumata et al. ............. 73/754 |
| 2004/0180467 | A1 | * | 9/2004 | Katsumata et al. ............. 438/53 |
| 2005/0230768 | A1 | * | 10/2005 | Mei ............................... 257/415 |
| 2009/0229370 | A1 | * | 9/2009 | Fujii et al. ....................... 73/780 |
| 2011/0018077 | A1 | * | 1/2011 | Miyata et al. .................. 257/417 |

FOREIGN PATENT DOCUMENTS

| | | |
|---|---|---|
| JP | 06-018345 A | 1/1994 |
| JP | 2009-075056 A | 4/2009 |

* cited by examiner

*Primary Examiner* — Andre Allen
(74) *Attorney, Agent, or Firm* — Rabin & Berdo, P.C.

(57) ABSTRACT

A pressure sensor of the present invention includes a substrate inside which a reference pressure chamber is formed, a closing body filled in a through-hole formed in the substrate such that the closing body penetrates through a portion between the surface of the substrate and the reference pressure chamber, and hermetically closes the reference pressure chamber, and a strain gauge provided inside the substrate between the surface of the substrate and the reference pressure chamber, and the electric resistance thereof being capable of changing by strain deformation of the substrate.

21 Claims, 25 Drawing Sheets

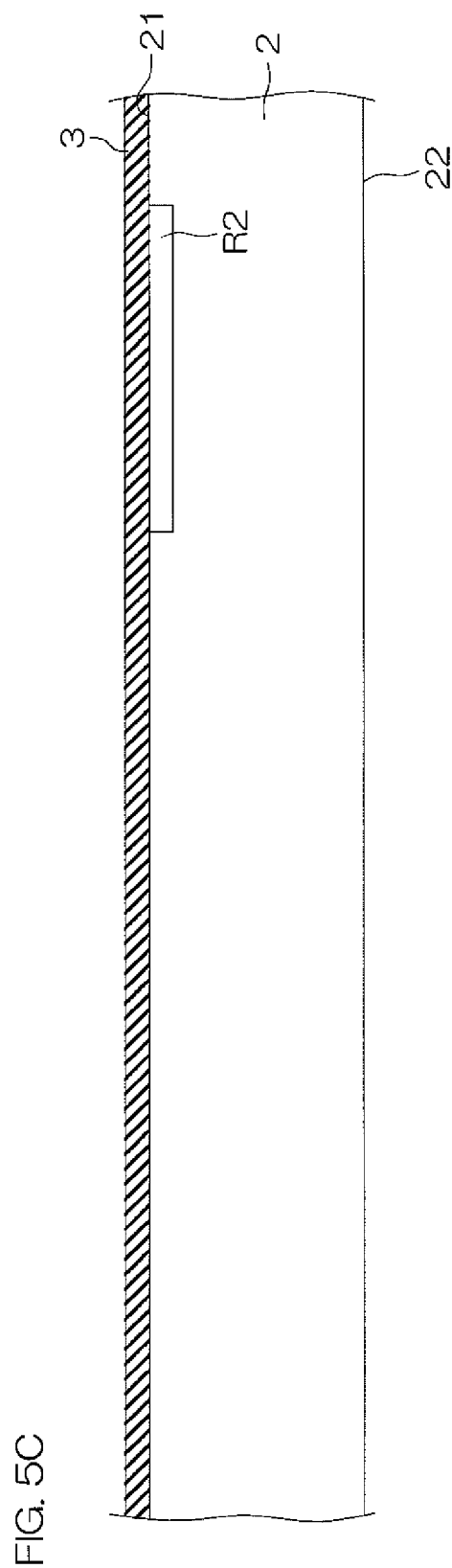

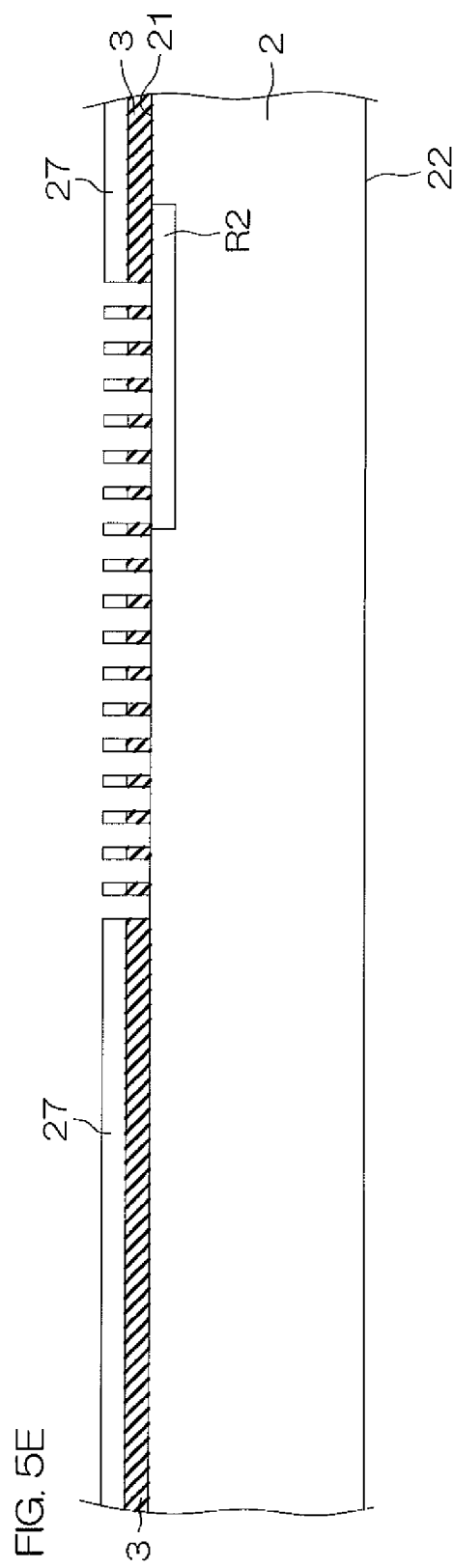

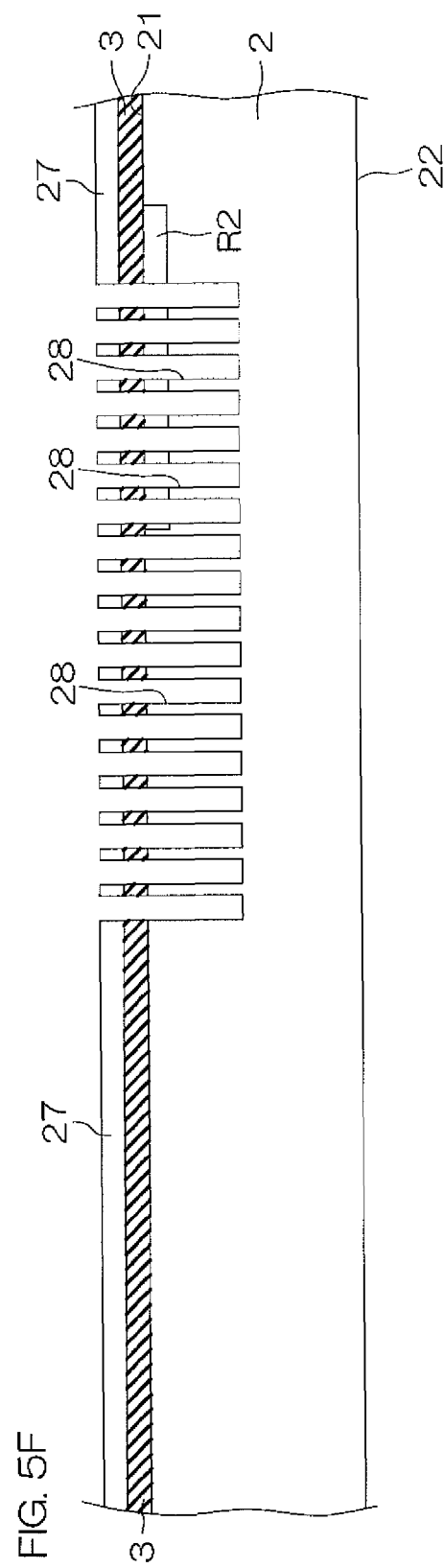

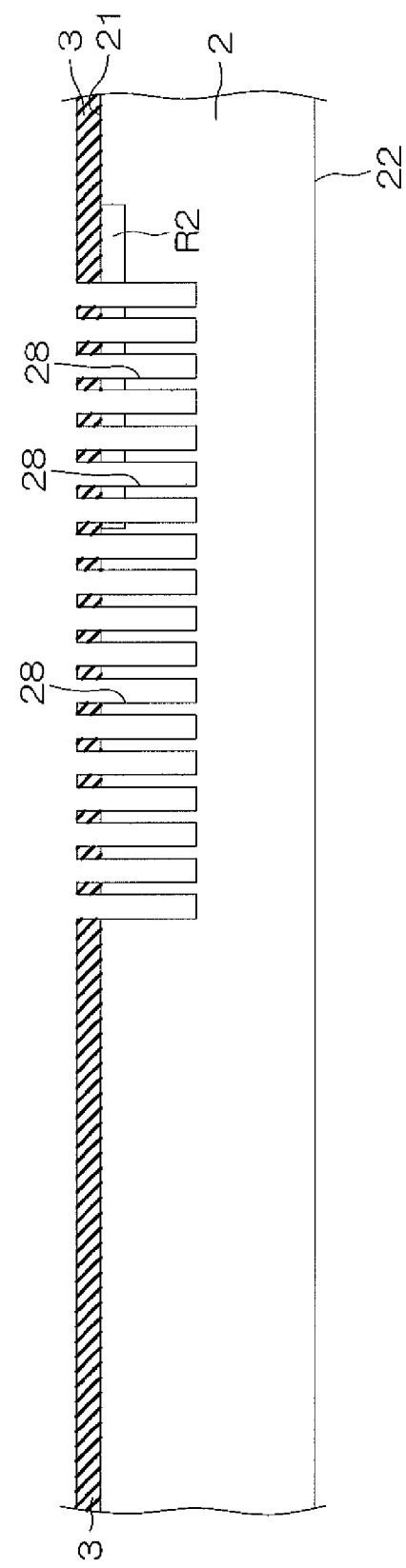

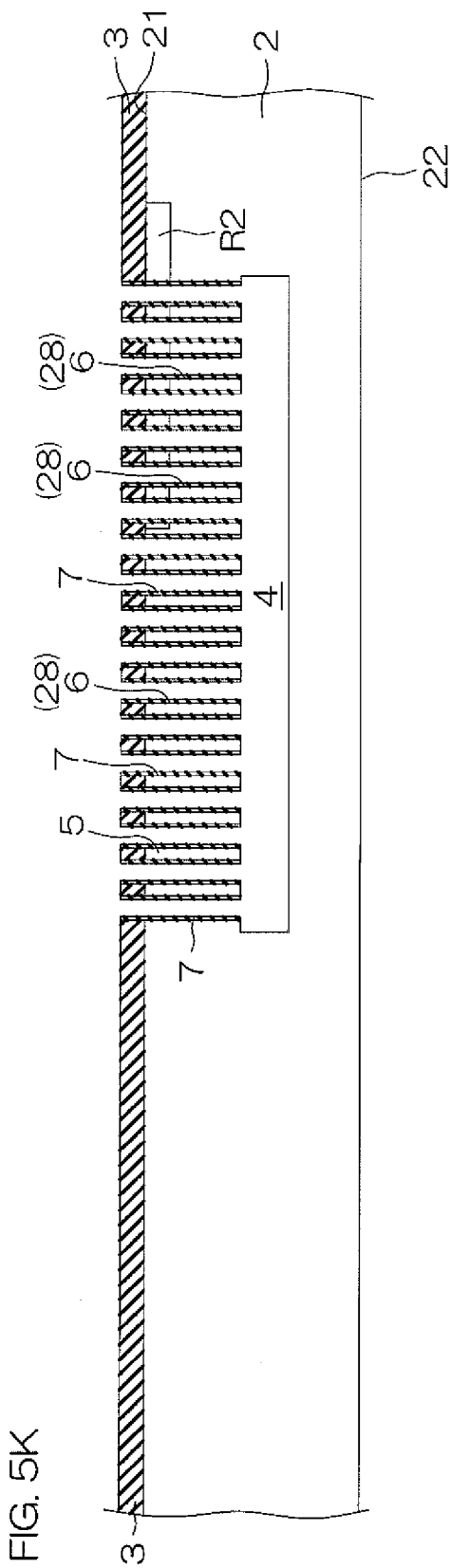

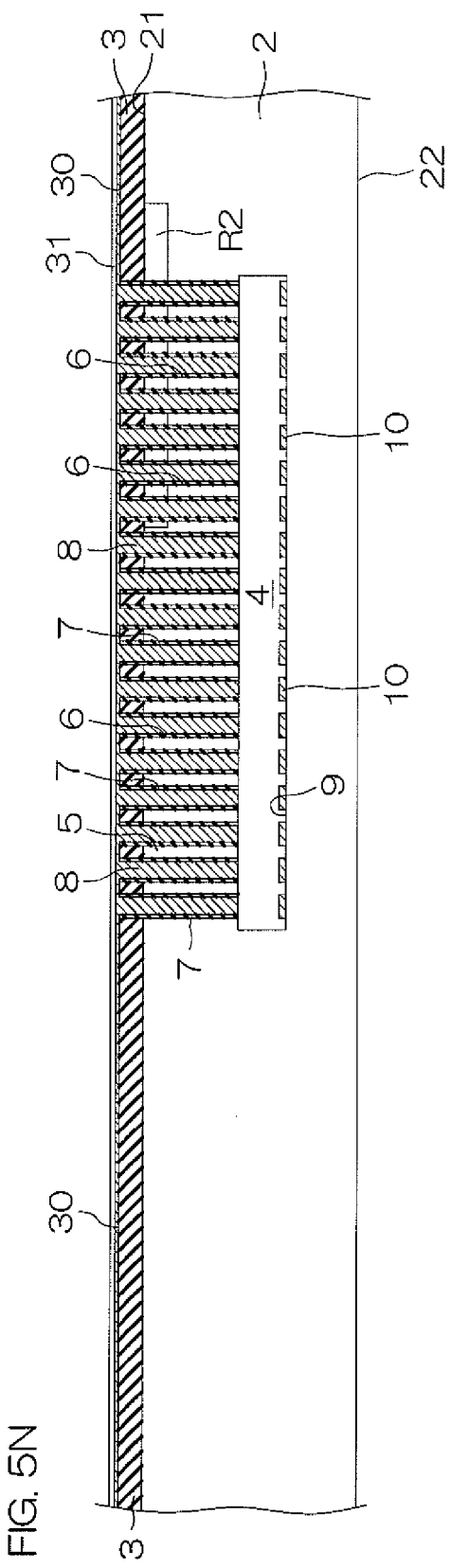

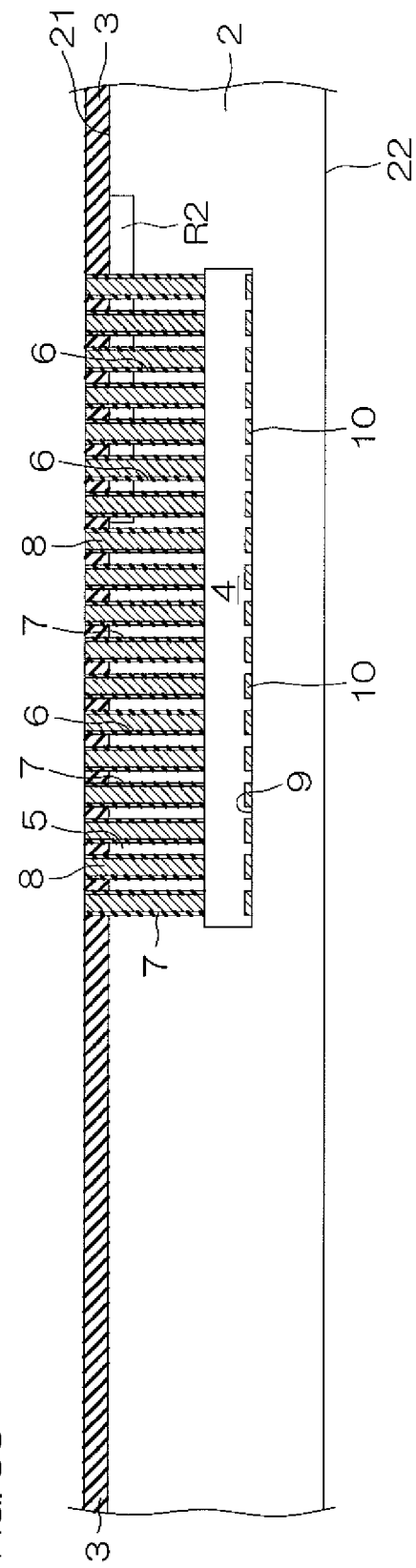

PRESSURE SENSOR AND METHOD FOR MANUFACTURING THE PRESSURE SENSOR

BACKGROUND OF THE INVENTION

1. Field of the Invention

The present invention relates to a pressure sensor and a method for manufacturing the same.

2. Description of Related Art

A pressure sensor which is manufactured according to the MEMS (Micro Electro Mechanical Systems) technique is used as a pressure sensor and pressure switch to be provided in industrial machinery, etc.

Such a pressure sensor includes a diaphragm formed by processing, for example, a silicon wafer to be partially thin as a pressure receiving portion, and detects a stress and a displacement caused when the diaphragm is deformed by a pressure applied from the outside. Such a pressure sensor is provided with a hollow for generating a reference pressure and detects a pressure applied to the diaphragm as a relative pressure with respect to the reference pressure.

For example, there is a known pressure sensor provided with a hollow (reference pressure chamber) defined by a diaphragm and a glass substrate by anodically bonding a silicon substrate having the diaphragm formed by processing the silicon substrate to be partially thin by etching and the glass substrate (for example, Pyrex (registered trademark) glass).

SUMMARY OF THE INVENTION

However, the conventional pressure sensor needs a glass substrate in addition to a silicon substrate, so that the cost is high. Further, the three-dimensional structure formed by bonding at least two substrates including a silicon substrate and a glass substrate is high in height, so that the height of the entire pressure sensor increases.

Further, when forming the hollow, after a silicon substrate is etched to form a diaphragm, in order to form a hollow by hermetically closing a recessed space on the diaphragm, a glass substrate must be accurately aligned and anodically bonded to the silicon substrate. Therefore, the sensor manufacturing process becomes troublesome.

An object of the present invention is to provide a pressure sensor which can be reduced in cost and downsized by providing a hollow as a reference pressure chamber inside a substrate.

Another object of the present invention is to provide a method for manufacturing a pressure sensor by which a low-cost downsized pressure sensor provided with a hollow as a reference pressure chamber inside a substrate can be easily manufactured.

The above-described or other objects, features, and effects of the present invention will be clarified from the following description of a preferred embodiment with reference to the accompanying drawings.

DETAILED DESCRIPTION OF PREFERRED EMBODIMENTS

Figure 1:
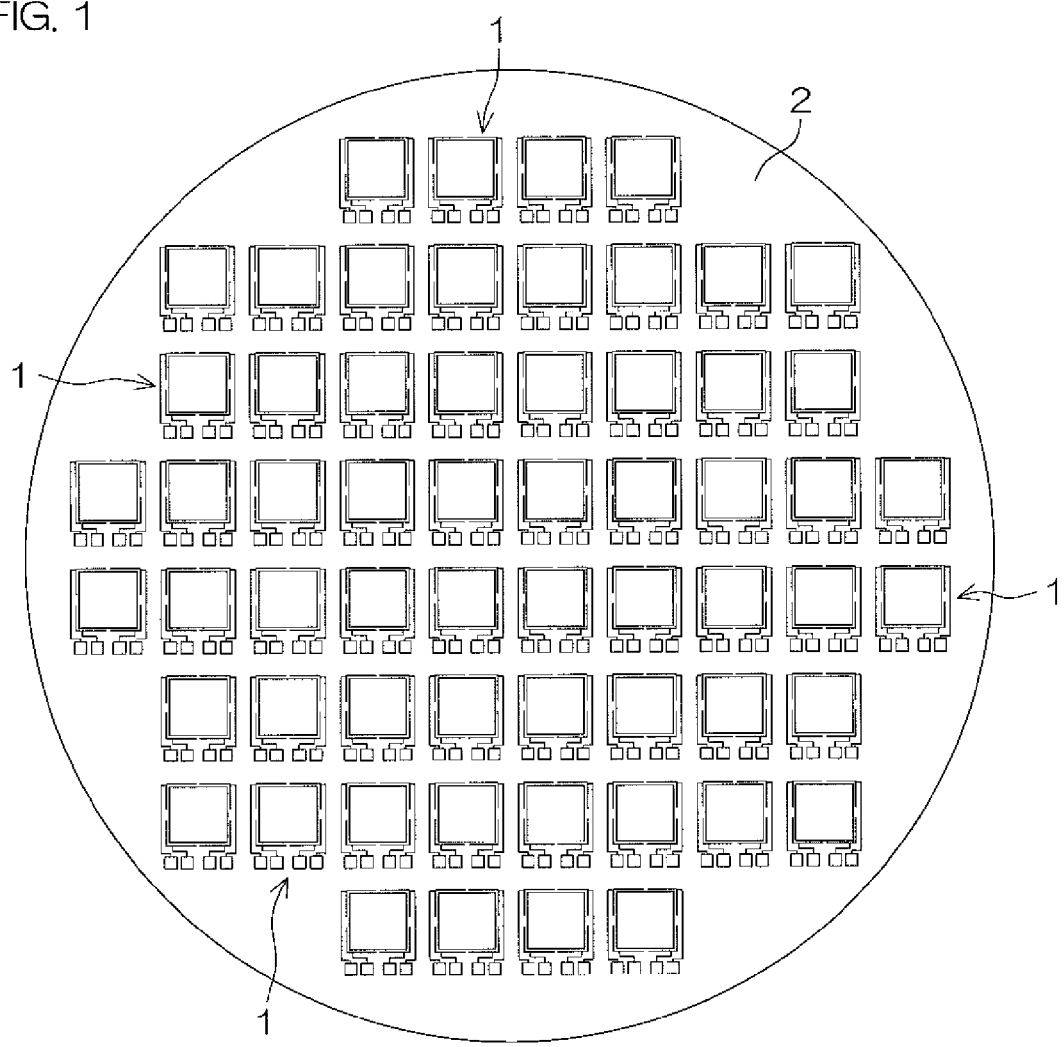
FIG. 1 is a general plan view of a pressure sensor according to a preferred embodiment of the present invention.

A pressure sensor according to an aspect of the present invention includes a substrate inside which a reference pressure chamber is formed, a closing body filled in a through-hole formed in the substrate such that the closing body penetrates through the portion between the surface of the substrate and the reference pressure chamber, and hermetically closes the reference pressure chamber, and a strain gauge provided inside the substrate between the surface of the substrate and the reference pressure chamber, and the electric resistance thereof being capable of changing by strain deformation of the substrate.

With this configuration, a hermetically closed reference pressure chamber is formed inside the substrate. Therefore, it is unnecessary to define the reference pressure chamber by bonding two substrates, so that the cost can be reduced.

A pressure applied to a portion (pressure receiving portion) between the surface of the substrate and the reference pressure chamber is detected by the strain gauge formed inside the substrate. Therefore, the sensor can be downsized.

The substrate is preferably made of silicon. Silicon is an inexpensive material, so that the cost of the substrate can be reduced.

When the substrate is made of silicon, the strain gauge preferably includes piezoresistances formed by selectively doping the surface layer portion of the substrate with an impurity. Consequently, the strain gauge (piezoresistances) can be formed as diffusion resistances formed by diffusing an impurity inside the substrate without projecting to the outside from the surface of the substrate. As a result, the structure of the pressure sensor can be simplified and further downsized.

The inside of the reference pressure chamber is preferably in a vacuum. When the inside of the reference pressure chamber is in a vacuum, the pressure inside the reference pressure chamber can be prevented from being changed by a change in temperature of an external environment. As a result, the pressure detection accuracy of the sensor can be improved.

The closing body is preferably made of aluminum. Aluminum is not an especially expensive material, and can be easily coated on the substrate by a simple method such as the sputtering method or the CVD method. Therefore, when the closing body is made of aluminum, the material cost of the pressure sensor can be prevented from increasing, and the manufacturing process can be simplified and the manufacturing efficiency can be improved.

The through-hole preferably has a diameter of 0.2 μm to 0.5 μm. When the size of the through-hole is within this range, the closing body can be formed by easily filling aluminum in the through-hole by the sputtering method or the CVD method.

A protective film may be interposed between a side surface of the through-hole and the closing body, and the protective film may be made of silicon oxide.

A plurality of through-holes may be formed. In this case, the plurality of through-holes are preferably formed to have circular shapes with the same size in a plan view (that is, the through-holes are columnar), and arranged so as to be distributed uniformly in a plan view. Accordingly, corresponding to the shape of the through-hole, the closing body can be formed to be circular in a plan view (columnar). Therefore, when the through-holes are arranged to be distributed uniformly in a plan view, the centers of gravity of the closing bodies are naturally distributed uniformly, so that scattering of the centers of gravity on the pressure receiving portion can be reduced.

In the pressure sensor, the area of the reference pressure chamber may be larger than the total area of the regions occupied by the through-holes.

A method for manufacturing a pressure sensor according to an aspect of the present invention includes a step of forming piezoresistances by selectively doping an impurity into the surface layer portion of a substrate made of silicon, a step of forming a plurality of recesses dug into portions in the middle of the thickness direction from the surface of the substrate in predetermined regions including the regions having the piezoresistances, a step of forming a protective film made of silicon oxide on inner surfaces of the plurality of recesses, a step of selectively removing the protective film from the bottom surfaces of the plurality of recesses, a step of forming a reference pressure chamber by digging the plurality of recesses by anisotropic etching and linking lower portions of the plurality of recesses to each other by isotropic etching, and a step of hermetically closing the reference pressure chamber by embedding a closing body between the surface of the substrate and the reference pressure chamber in the plurality of recesses.

According to this method, in order to form the reference pressure chamber inside the substrate, the inside of the silicon substrate is hollowed by anisotropic etching and isotropic etching, and closing bodies for hermetically closing the hollow are filled in through-holes (recesses) penetrating through the portion between the substrate surface and the hollow. Specifically, to form the reference pressure chamber, processings such as etching and formation of the closing bodies are only applied to the silicon substrate. Therefore, it is unnecessary to separately prepare a glass substrate to be bonded to the silicon substrate and bond the glass substrate to the silicon substrate.

Then, a pressure sensor manufactured according to this method has a reference pressure chamber inside one substrate, so that the cost can be prevented from being increased by use of another substrate, and the reference pressure chamber and the piezoresistances (strain gauge) are collectively provided in one substrate, so that the pressure sensor is downsized. Therefore, according to this method, a low-cost downsized pressure sensor can be easily manufactured.

Embedding of the closing bodies is preferably performed in a vacuum. By performing embedding of the closing bodies in a vacuum, silicon can be prevented from being oxidized when forming the closing bodies.

The closing bodies are preferably formed by coating aluminum on the inner surfaces of the recesses by the sputtering method and performing reflow. According to this method, by reflow after the sputtering method, aluminum coated on the inner surfaces of the through-holes by the sputtering method can be thermally expanded, and accordingly, the recesses (through-holes) can be closed by aluminum. Accordingly, the reference pressure chamber can be hermetically closed. Thus, the reference pressure chamber can be hermetically closed by a simple method such as the sputtering method and reflow, so that the manufacturing process of the pressure sensor can be further simplified, and the manufacturing efficiency can be improved.

The closing bodies may be formed by filling aluminum in the inner surfaces of the recesses by the CVD method. According to this method, by filling aluminum by the CVD method, the recesses (through-holes) can be closed. Accordingly, the reference pressure chamber can be hermetically closed. Thus, the reference pressure chamber can be hermetically closed by one step of filling by the CVD method, so that the manufacturing process of the pressure sensor can be made easier, and the manufacturing efficiency can be improved.

Hereinafter, a preferred embodiment of the present invention will be described in detail with reference to the accompanying drawings.

Figure 2:
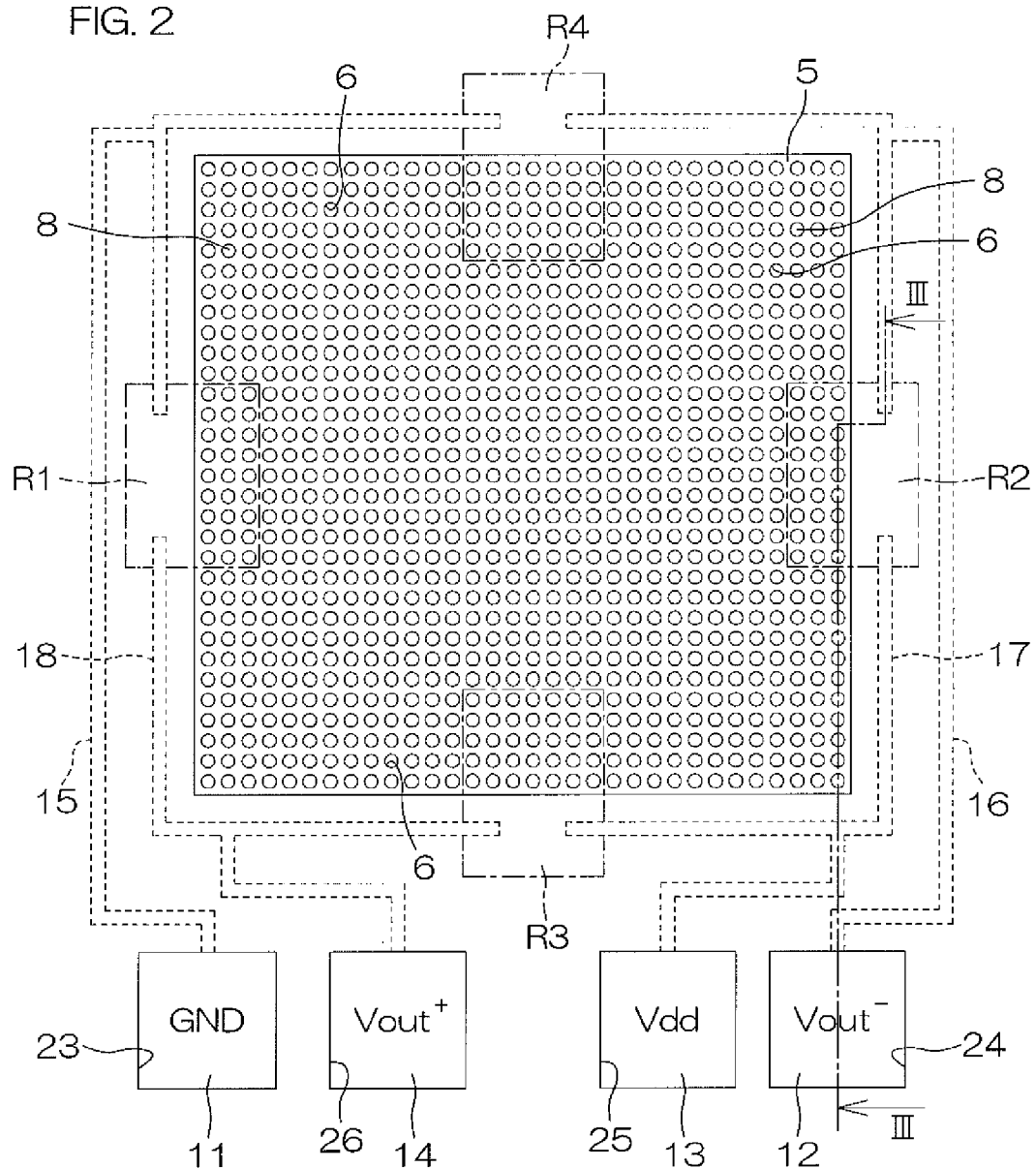
FIG. 2 is an enlarged plan view of the pressure sensor shown in FIG. 1.
Figure 3:
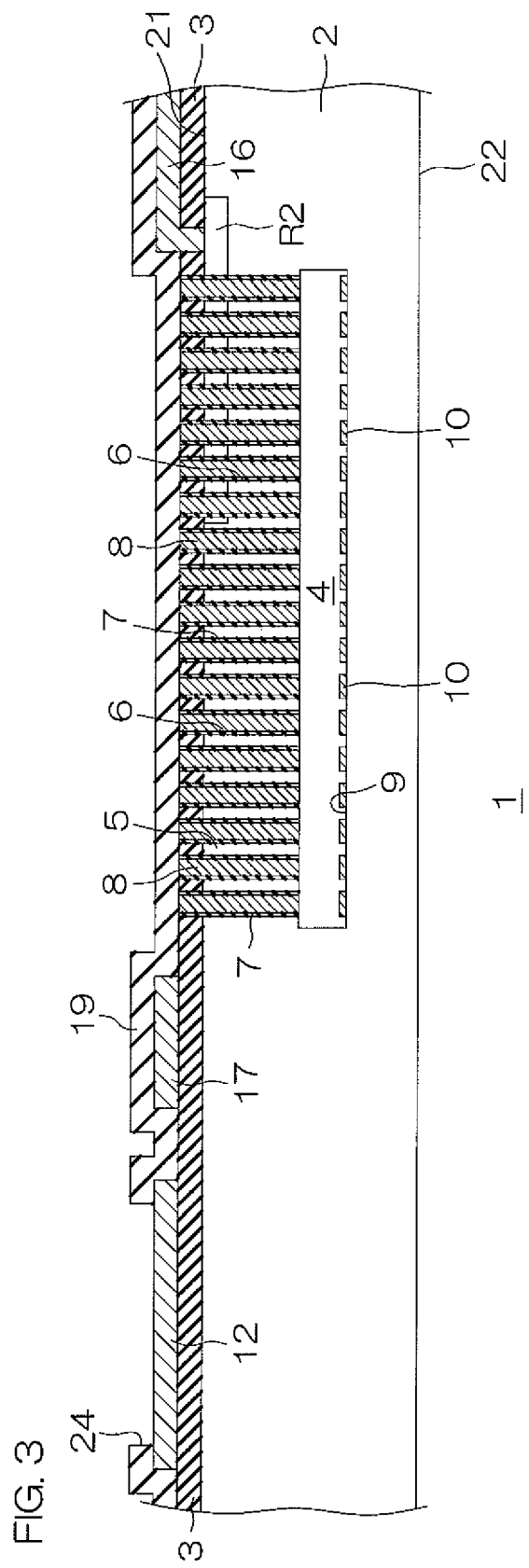
FIG. 3 is an essential portion sectional view of the pressure sensor shown in FIG. 2, taken along a cut line III-III of FIG. 2.
Figure 4:
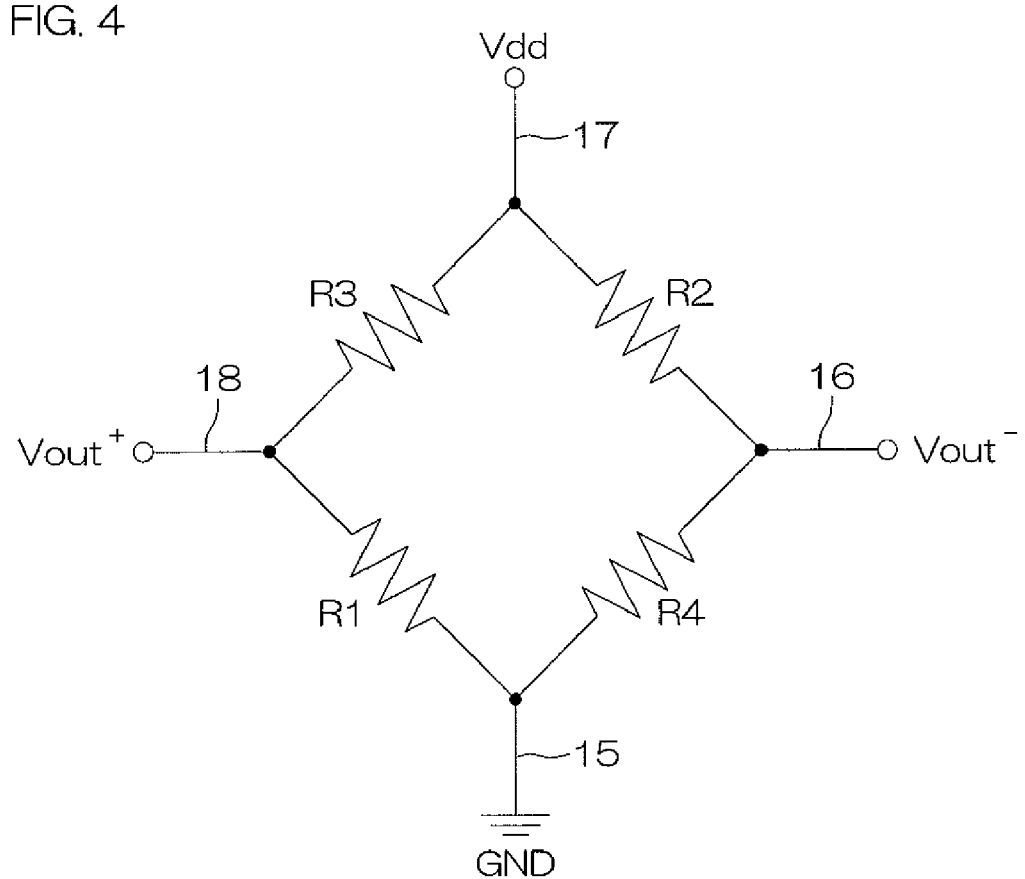
FIG. 4 is a circuit diagram of a bridge circuit including metal wirings and piezoresistances.

FIG. 1 is a general plan view of a pressure sensor according to a preferred embodiment of the present invention. FIG. 2 is an enlarged plan view of the pressure sensor shown in FIG. 1. FIG. 3 is an essential portion sectional view of the pressure sensor shown in FIG. 2, taken along a cut line III-III of FIG. 2. FIG. 4 is a circuit diagram of a bridge circuit including metal wirings and piezoresistances.

A number of pressure sensors 1 are formed by being arranged regularly vertically and horizontally on one silicon wafer 2 in the manufacturing process as shown in FIG. 1. The silicon wafer 2 is a p-type silicon substrate in the present preferred embodiment (hereinafter, also referred to as "silicon substrate 2").

Each pressure sensor 1 includes a p-type silicon substrate 2. The surface 21 of the silicon substrate 2 is coated with a surface insulating film 3 made of silicon oxide ($SiO_2$). On the other hand, the back surface 22 of the silicon substrate 2 is an exposed surface.

Inside the silicon substrate 2, a flat space 4 (hollow) is formed in a direction parallel to the principal surface of the silicon substrate 2 in each pressure sensor 1. The flat space 4 is formed to have a square shape (three-dimensionally, a rectangular parallelepiped) in the present preferred embodiment in a plan view. Due to this flat space 4, the surface 21 side of the silicon substrate 2 becomes thinner on the portion opposed to the flat portion 4 than the remaining portion. Accordingly, the silicon substrate 2 has, on the surface 21 side of the flat space 4, a diaphragm 5 which has a square shape in a plan view and is displaceable in the opposing direction to the flat space 4 (thickness direction). The diaphragm 5 is supported integrally on the remaining portion on the silicon substrate 2. In FIG. 3, for convenience of description, the diaphragm 5 is shown to be thicker than the portion on the back surface 22 side with respect to the flat space 4 of the silicon substrate 2.

In the diaphragm 5, a large number of through-holes 6 circular in a plan view and penetrating through the portion between the surface 21 of the silicon substrate 2 and the flat space 4 are formed and arranged in a square matrix all over the diaphragm 5. Specifically, the through-holes 6 are arranged in a matrix at even intervals along a row direction along one side of the diaphragm 5 and a column direction along another side orthogonal to the one side in a region inside the contour of the diaphragm 5. All through-holes 6 also penetrate through the surface insulating film 3 on the diaphragm 5. The diameter of each through-hole 6 is, for example, 0.2 μm to 0.5 μm (preferably, 0.4 μm) in this preferred embodiment. The depth of each through-hole 6 is, for example, 5000 Å to 10000 Å in the present preferred embodiment. The through-holes 6 are formed in a matrix in a region inside the contour of the diaphragm 5 in a plan view, so that the planar area of the flat space 4 is larger than the total area of the regions occupied by the through-holes 6 (sum of planar areas of all through-holes 6) in a plan view.

The side surface of the through-hole 6 is coated with a protective thin film 7 made of silicon oxide ($SiO_2$). In all through-holes 6, aluminum (Al) is filled and embedded inside the protective thin films 7. Accordingly, all through-holes 6 are closed by the aluminum filling bodies 8, and the flat space 4 below the through-holes 6 is hermetically closed as a reference pressure chamber whose internal pressure is used as a reference of pressure detection. The flat space 4 is kept in a vacuum or decompressed (for example, $10^{-5}$ Torr) state in the present preferred embodiment. Among a plurality of inner walls of the silicon substrate 2 which partition the flat space 4, on a bottom wall 9 opposed to the diaphragm 5, aluminum (Al) film pieces 10 are dotted on portions opposed to the through-holes 6.

Each pressure sensor 1 further includes piezoresistances R1 to R4 as a strain gauge, metal terminals 11 to 14, and metal wirings 15 to 18.

The piezoresistances R1 to R4 are diffusion resistances formed by introducing an n-type impurity into the silicon substrate 2, and are formed across the inside and the outside of the diaphragm 5 in a plan view in a surface layer portion of the silicon substrate 2. The piezoresistances R1 to R4 are formed to have a rectangular shape in a plan view, and a total of four piezoresistances are provided at central positions of the sides of the diaphragm 5.

The metal terminals 11 to 14 include a ground terminal 11 (GND), a negative side voltage output terminal 12 (Vout$^-$), a voltage applying terminal 13 (Vdd), and a positive side voltage output terminal 14 (Vout$^+$). These four metal terminals 11 to 14 are formed on the surface insulating film 3, and are arranged along one side of the diaphragm 5 in a plan view. The metal terminals 11 to 14 are made of aluminum (Al) in this preferred embodiment.

The metal wirings 15 to 18 are wirings for forming a bridge circuit by arranging the piezoresistances R1 to R4 in a bridge form (Wheatstone bridge). In detail, the metal wirings include the ground wiring 15 which connects the piezoresistance R1 and the piezoresistance R4 outside the diaphragm 5, and is connected to the ground terminal 11, the negative side output wiring 16 which connects the piezoresistance R2 and the piezoresistance R4 outside the diaphragm 5, and is connected to the negative side voltage output terminal 12, the voltage applying wiring 17 which connects the piezoresistance R2 and the piezoresistance R3 outside the diaphragm 5, and is connected to the voltage applying terminal 13, and the positive side output wiring 18 which connects the piezoresistance R1 and the piezoresistance R3 outside the diaphragm 5, and is connected to the positive side voltage output terminal 14. These metal wirings 15 to 18 are made of aluminum (Al) in this preferred embodiment, and are formed on the surface insulating film 3.

Thus, in the bridge circuit including the metal wirings 15 to 18 and the piezoresistances R1 to R4 (refer to FIG. 4), the piezoresistance R1 and the piezoresistance R2 are paired and opposed to each other on the circuit, and the piezoresistance R3 and the piezoresistance R4 are paired and opposed to each other on the circuit.

The metal terminals 11 to 14 and the metal wirings 15 to 18 are coated with a passivation film 19 made of silicon nitride (SiN). In the passivation film 19, openings 23 to 26 through which the metal terminals are exposed as pads (in FIG. 3, opening 24 through which the negative side voltage output terminal 12 is exposed) are formed.

In this pressure sensor 1, when the diaphragm 5 is subjected to a pressure (for example, pressure of gas) from the surface 21 side of the silicon substrate 2, a pressure difference is caused between the inside and the outside of the flat space 4 and causes the diaphragm 5 to be displaced in the thickness direction of the silicon substrate 2, and due to this displacement, the silicon crystal forming the piezoresistances R1 to R4 strains and the resistance values change. When a constant bias voltage is applied to the voltage applying terminal 13, according to resistance value changes of the piezoresistances R1 to R4, the voltage between the output terminals 12 and 14 changes. Therefore, based on this voltage change, the pressure applied to the pressure sensor 1 can be detected.

Figure 5A:
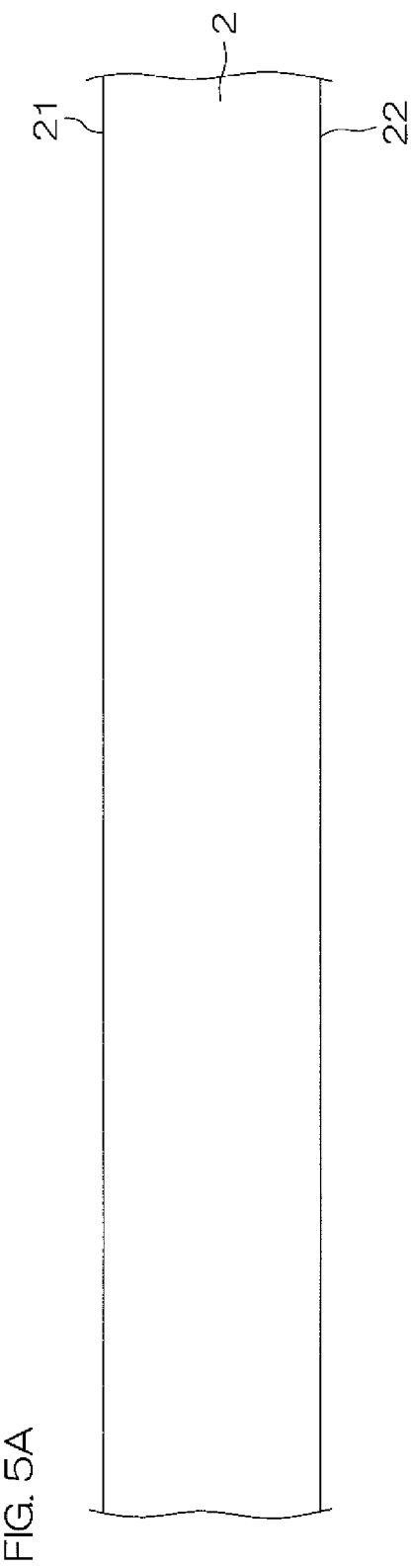
FIG. 5A to FIG. 5U are schematic sectional views showing a manufacturing process of the pressure sensor shown in FIG. 2 and FIG. 3.
Figure 5B:
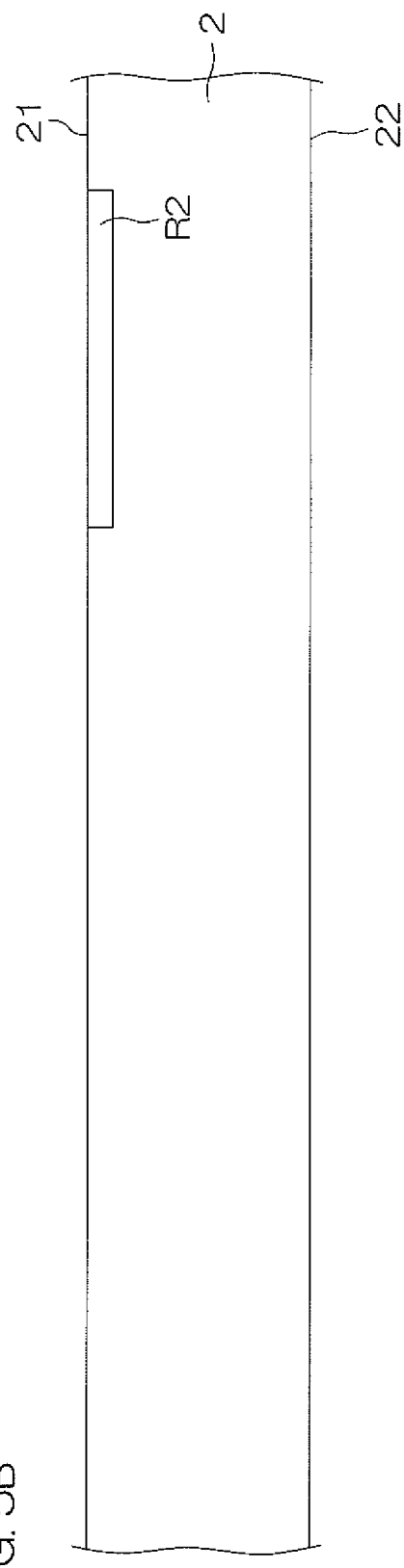
Figure 5D:
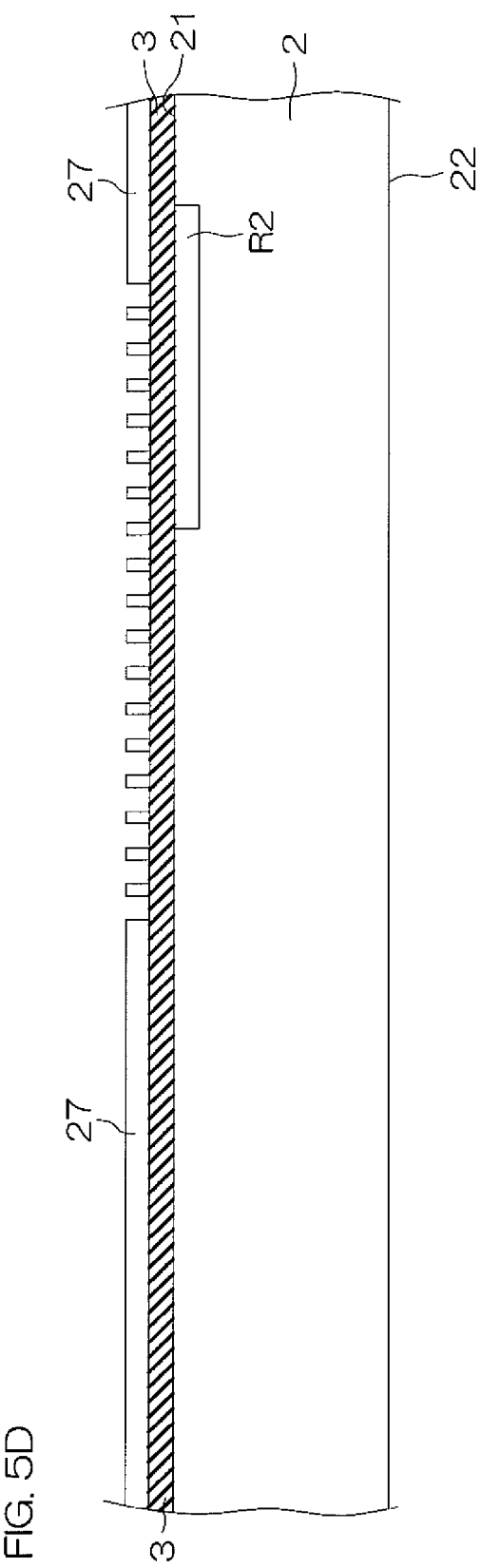
Figure 5H:
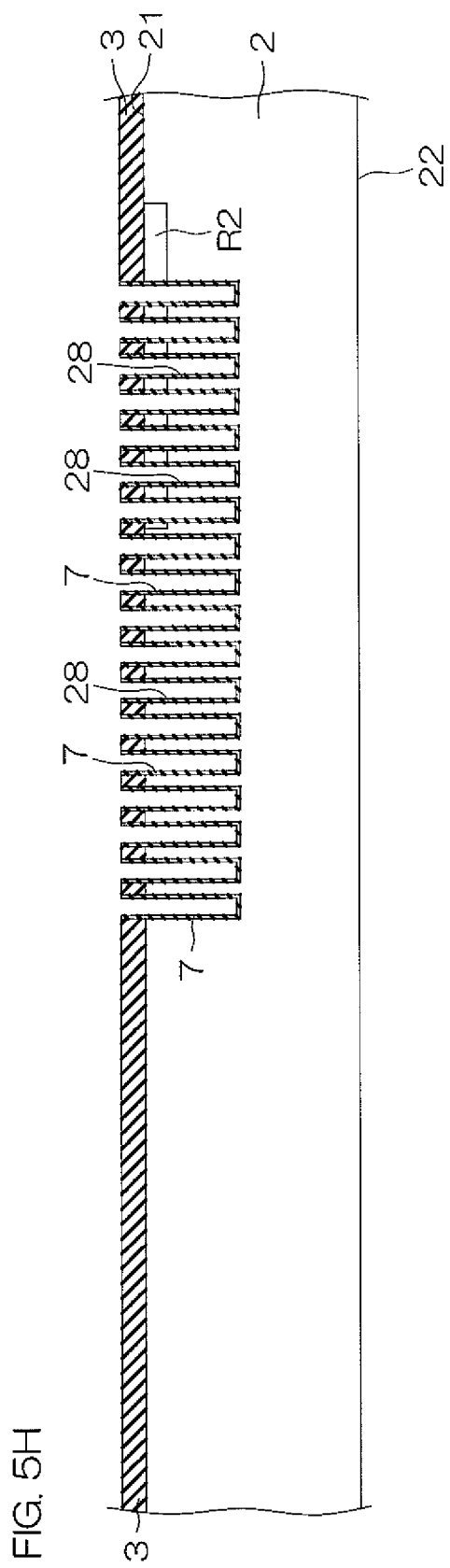
Figure 5I:
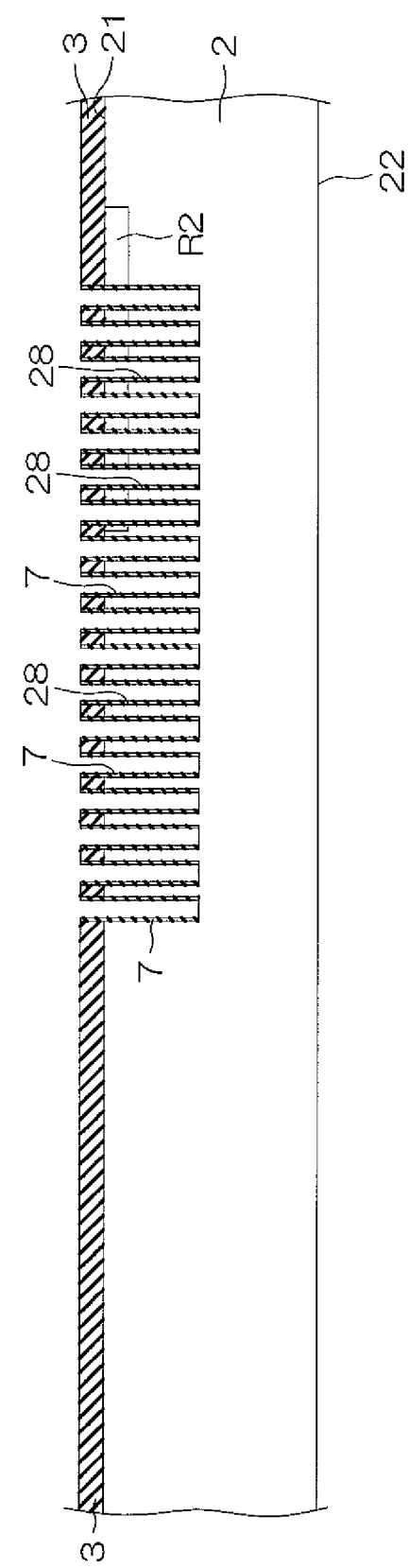
Figure 5J:
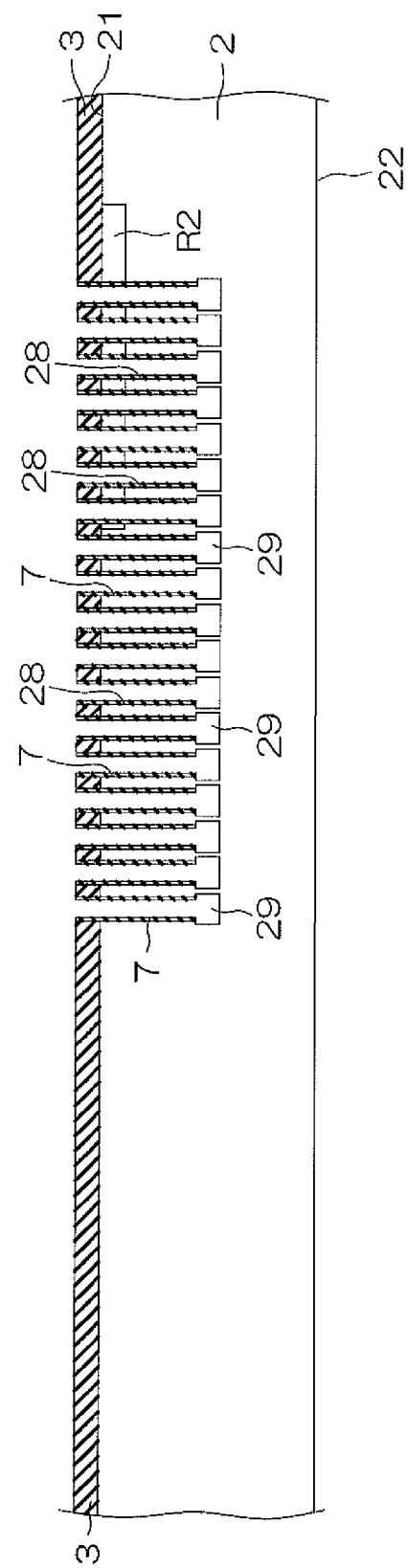
Figure 5L:
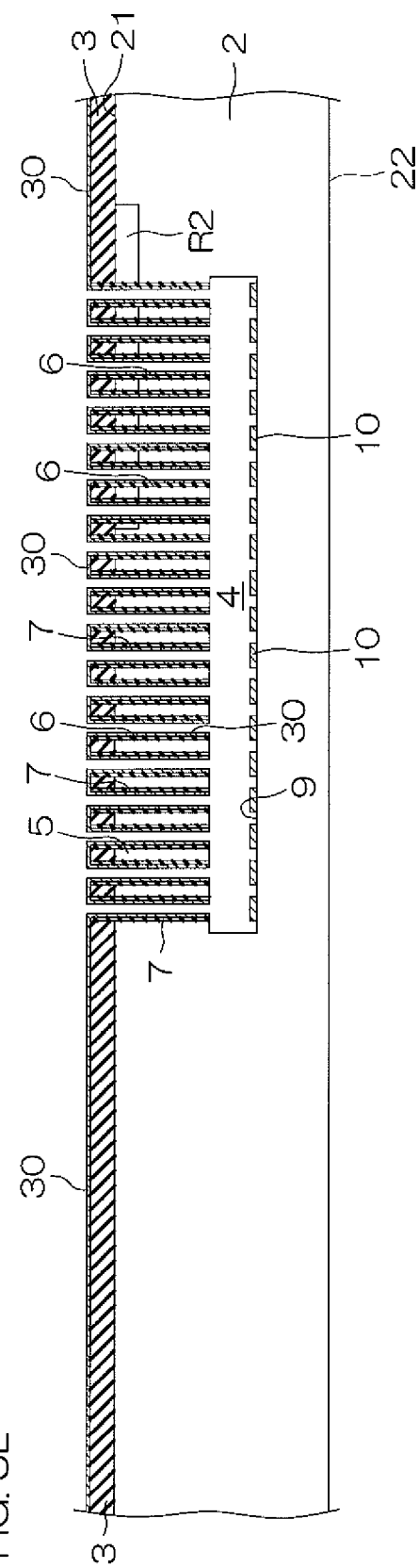
Figure 5M:
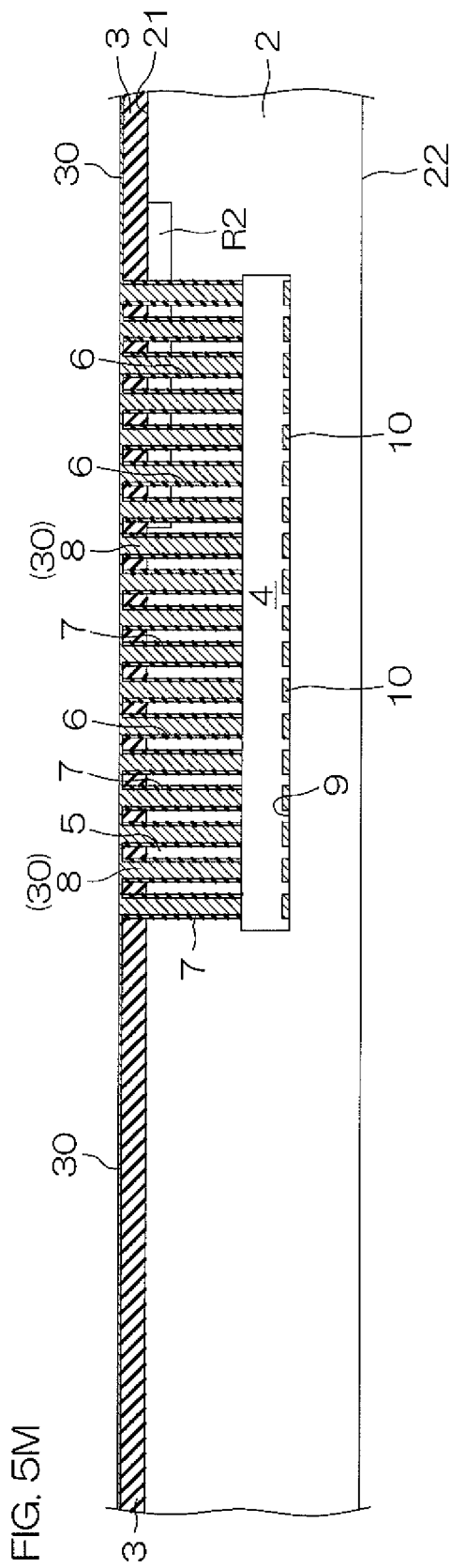
Figure 5P:
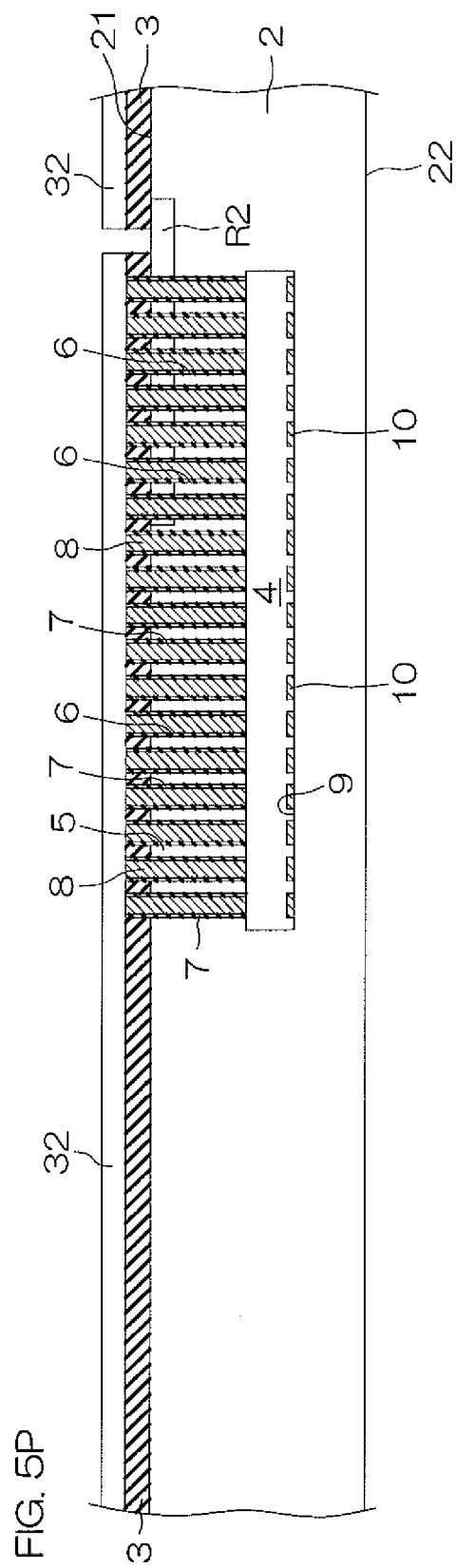
Figure 5Q:
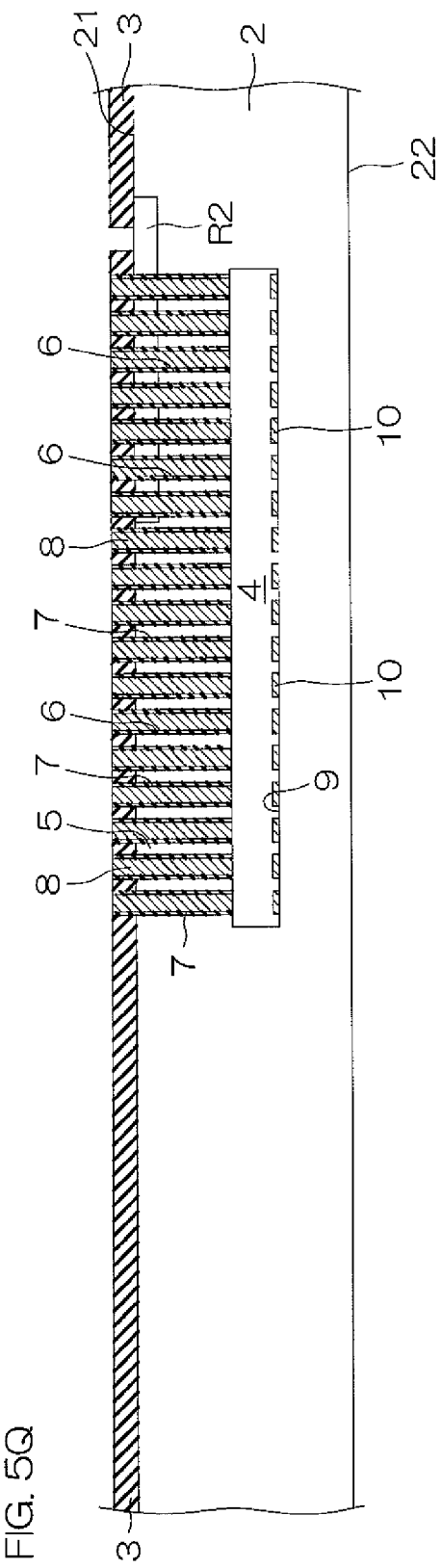
Figure 5R:
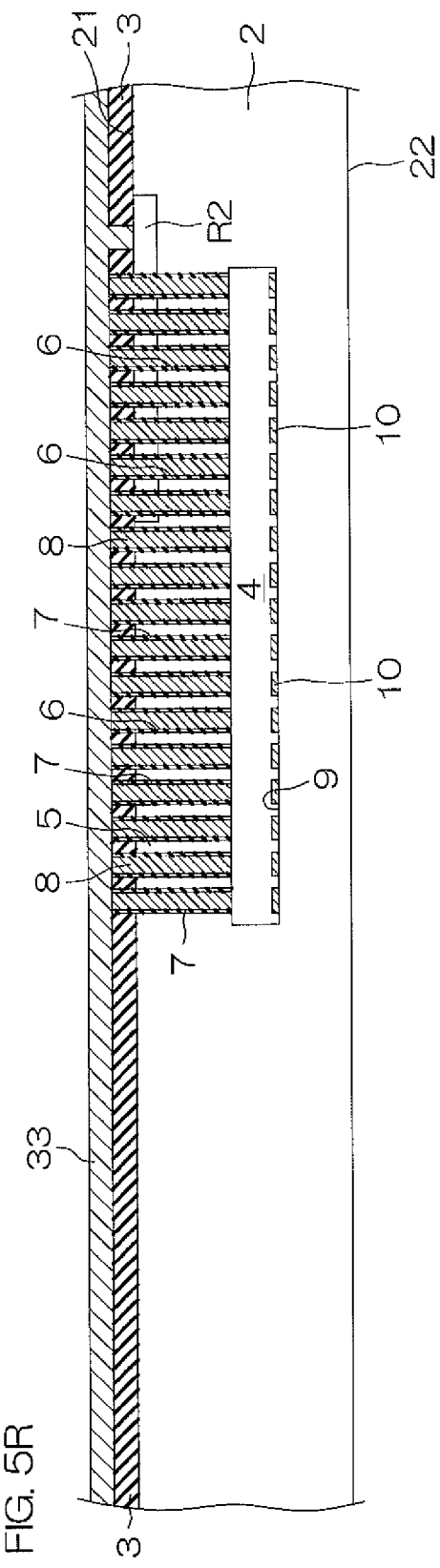
Figure 5S:
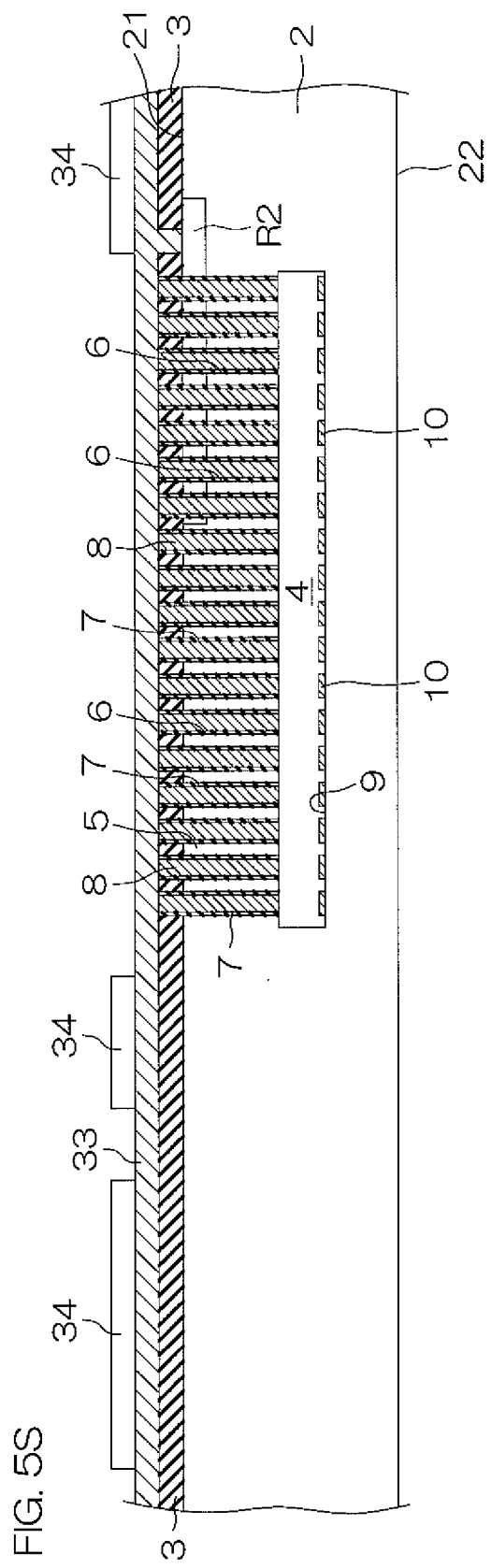
Figure 5T:
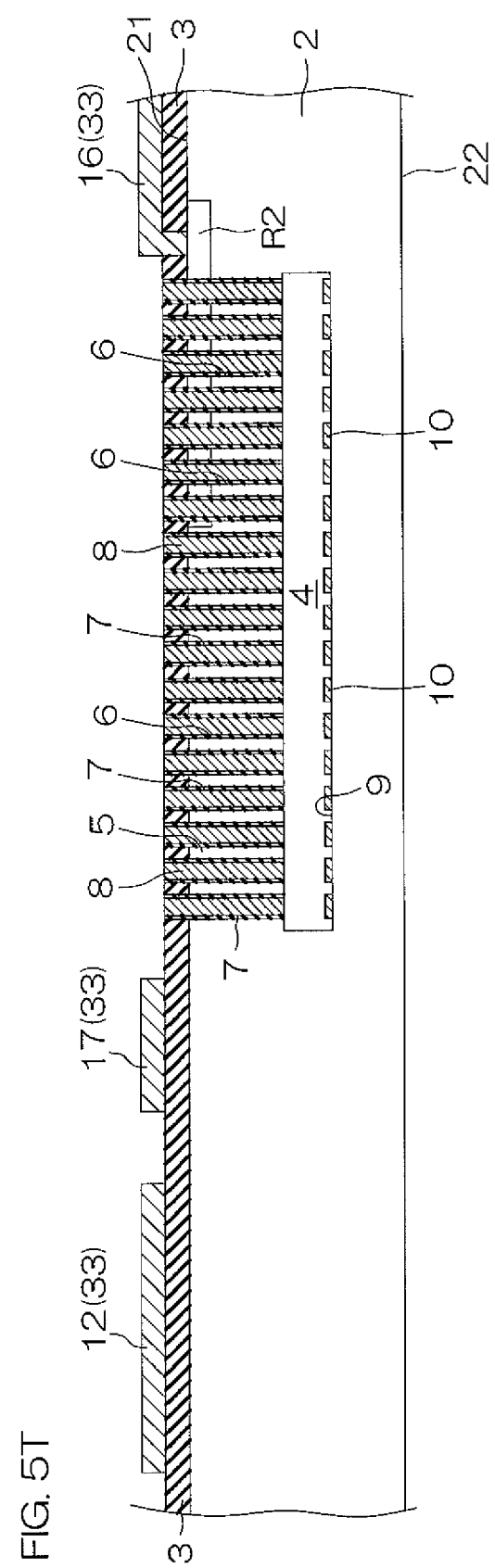
Figure 5U:
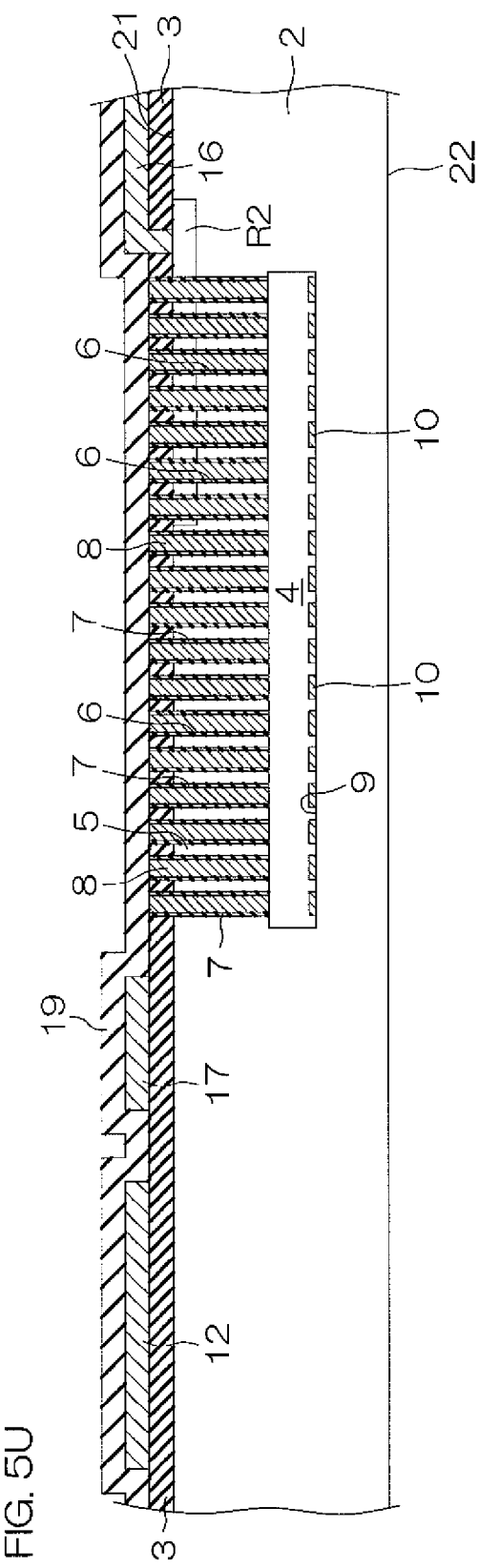

FIG. 5A to FIG. 5U are schematic sectional views showing a manufacturing process of the pressure sensor shown in FIG. 2 and FIG. 3.

To manufacture the pressure sensor 1, for example, first, as shown in FIG. 5A, a silicon substrate 2 (wafer) is prepared. Then, as shown in FIG. 5B, in the surface layer portion of the silicon substrate 2, an n-type impurity (for example, P (phosphorus) is implanted (injected) via a mask (not shown) in a predetermined pattern. Subsequently, a drive-in diffusion treatment is performed. By this drive-in diffusion treatment, ions of the n-type impurity injected into the silicon substrate 2 are diffused to form the piezoresistances R1 to R4 in the silicon substrate 2 (only the piezoresistance R2 is shown in FIG. 5B to FIG. 5U).

Then, as shown in FIG. 5C, by the PECVD (Plasma Enhanced Chemical Vapor Deposition) method, the surface insulating film 3 made of silicon oxide ($SiO_2$) is formed on the surface 21 of the silicon substrate 2.

Then, as shown in FIG. 5D, by photolithography, a resist pattern 27 is formed on the surface insulating film 3. The resist pattern 27 has a plurality of openings corresponding to the plurality of through-holes 6. The regions in which the openings are formed partially overlap the regions in which the piezoresistances R1 to R4 are formed.

Next, as shown in FIG. 5E, by plasma etching using the resist pattern 27 as a mask, the surface insulating film 3 is selectively removed.

Next, as shown in FIG. 5F, by anisotropic deep RIE (Reactive Ion Etching) using the resist pattern 27 as a mask, specifically, by the Bosch process, the silicon substrate 2 is dug. Accordingly, a plurality of columnar recesses 28 arranged in a square matrix in a plan view are formed on the silicon substrate 2. In the Bosch process, a step of etching the silicon substrate 2 by using $SF_6$ (sulfur hexafluoride) and a step of forming a protective film on the etched surface by using $C_4F_8$ (perfluorocyclobutane) are alternately repeated. Accordingly, the silicon substrate 2 can be etched with a high aspect ratio, however, wavy irregularities called scallop are formed on the etched surface (inner peripheral surface of the columnar recess 28). After forming the columnar recesses 28, as shown in FIG. 5G, the resist pattern 27 is peeled off.

Next, as shown in FIG. 5H, by thermal oxidation or the PECVD method, on the entire inner surfaces of the columnar recesses 28 (that is, the inner peripheral surfaces and bottom surfaces of the columnar recesses 28), a protective thin film 7 made of silicon oxide ($SiO_2$) is formed.

Then, as shown in FIG. 5I, by etch back, the portions of the protective thin film 7 on the bottom surfaces of the columnar recesses 28 are removed. Accordingly, the bottom surfaces of the columnar recesses 28 are exposed.

Next, as shown in FIG. 5J, by anisotropic deep RIE using the surface insulating film 3 as a mask, the bottom surfaces of the columnar recesses 28 are further dug. Accordingly, on the bottom portions of the columnar recesses 28, exposure spaces 29 in which the crystal surface of the silicon substrate 2 is exposed are formed. Subsequent to this anisotropic deep RIE, as shown in FIG. 5K, by isotropic RIE, reactive ions and etching gas are supplied to the exposure spaces 29 of the columnar recesses 28. Then, due to action of the reactive ions, etc., the silicon substrate 2 is etched in a direction parallel to the silicon substrate 2 while the silicon substrate 2 is etched in the thickness direction starting from the exposure spaces 29. Accordingly, all exposure spaces 29 adjacent to each other are integrated, a flat space 4 is formed inside the silicon substrate 2, and a diaphragm 5 is formed on the surface 21 side of the flat space 4. The columnar recesses 28 become through-holes 6.

Then, as shown in FIG. 5L, by the sputtering method, aluminum as a material of the aluminum filling bodies 8 is coated on the surface insulating film 3. Accordingly, while the communication state between the inside and the outside of the flat space 4 is held by the through-holes 6, an aluminum coating film 30 is formed to cover the entirety of the surfaces of the surface insulating film 3 and the protective thin film 7. At this time, a part of aluminum enters the flat space 4, and accordingly, aluminum film pieces 10 are dotted on the bottom wall 9 of the flat space 4.

Then, as shown in FIG. 5M, by thermally expanding the aluminum coating film 30 inside each through-hole 6 by reflow in a vacuum (for example, 350 to 450° C.), the through-holes 6 are completely filled with aluminum and closed. Accordingly, aluminum filling bodies 8 are formed in the through-holes 6, and the flat space 4 is closed as a vacuum reference pressure chamber.

Then, as shown in FIG. 5N, a photoresist 31 is applied onto all regions of the aluminum coating film 30 on the surface insulating film 3.

Then, as shown in FIG. 5O, by etch back, the portions on the surface insulating film 3 of the photoresist 31 and the aluminum coating film 30 are collectively removed. Accordingly, the surface insulating film 3 is exposed.

Then, as shown in FIG. 5P, by photolithography, a resist pattern 32 is formed on the surface insulating film 3.

Then, as shown in FIG. 5Q, by plasma etching using the resist pattern 32 as a mask, the surface insulating film 3 is selectively removed. Thereafter, the resist pattern 32 is peeled off.

Next, as shown in FIG. 5R, by the sputtering method, aluminum is deposited on the surface insulating film 3. The aluminum deposition film 33 thus formed on the surface insulating film 3 is connected to the piezoresistances R1 to R4 via the surface insulating film 3.

Next, as shown in FIG. 5S, by photolithography, a resist pattern 34 is formed on the aluminum deposition film 33.

Next, as shown in FIG. 5T, by plasma etching using the resist pattern 34 as a mask, the aluminum deposition film 33 is selectively removed. Accordingly, the metal terminals 11 to 14 and the metal wirings 15 to 18 are formed concurrently. Thereafter, the resist pattern 34 is peeled off.

Next, as shown in FIG. 5U, by the CVD method, a passivation film 19 is formed on the surface insulating film 3. Thereafter, by photolithography and etching, openings 23 to 26 through which the metal terminals 11 to 14 are exposed as pads (in FIG. 5U, opening 24 through which the negative side voltage output terminal 12 is exposed) are formed in the passivation film 19, and accordingly, the pressure sensor 1 shown in FIG. 2 and FIG. 3 is obtained.

According to the above-described method, after the columnar recesses 28 are formed in the silicon substrate 2 by anisotropic deep RIE (FIG. 5I), by successively performing anisotropic deep RIE and isotropic RIE (FIG. 5J to FIG. 5K), the flat space 4 is formed inside the silicon substrate 2, and the diaphragm 5 can be formed. Then, an aluminum coating film 30 is coated on the insides of the through-holes 6 formed by isotropic RIE, and further, by thermally expanding the aluminum coating film 30 by reflow, all through-holes 6 can be closed. As a result, the flat space 4 can be hermetically closed while being held at a reference pressure (vacuum) for detecting a pressure.

Specifically, according to the manufacturing method of the present preferred embodiment, to form the flat space 4 as a reference pressure chamber, various treatments such as deep RIE, Al sputtering, and reflow are only applied to the silicon substrate 2, and therefore, the step of preparing separately a glass substrate to be bonded to the silicon substrate 2 and bonding the glass substrate to the silicon substrate 2 is unnecessary.

Further, the pressure sensor 1 manufactured according to this method includes a reference pressure chamber inside one silicon substrate 2, so that the cost can be prevented from being increased by use of another substrate (for example, a glass substrate). In addition, the reference pressure chamber and the piezoresistances R1 to R4 are collectively formed in one silicon substrate 2, so that the pressure sensor is downsized. Therefore, in the present preferred embodiment, a low-cost and downsized pressure sensor 1 can be easily manufactured. Moreover, like the silicon substrate 2, the substrate to be used is made of an inexpensive material, so that the cost necessary for the substrate can be further reduced. Also, aluminum for hermetically closing the flat space 4 is not especially expensive, so that the material cost of the pressure sensor 1 can be further prevented from being increased.

The columnar recesses 28 (through-holes 6) are formed by the Bosch process, and wavy irregularities called scallop are formed on the inner peripheral surfaces of the columnar recesses 28, so that the protective thin film 7 and the aluminum coating film 30 can be coated on the inner peripheral surfaces of the columnar recesses 28 (through-holes 6) with optimum coverage.

The reflow for thermally expanding the aluminum coating film 30 is performed in a vacuum, so that silicon can be prevented from being oxidized during reflow. That is, formation of an oxide film on the inner walls of the silicon substrate 2 that partition the flat space 4 can be suppressed. The inside of the reference pressure chamber (flat space 4) thus formed is kept in a vacuum, so that the pressure inside the flat space 4 can be prevented from being changed by a temperature change in an external environment. As a result, the pressure detection accuracy of the pressure sensor 1 can be improved.

According to this pressure sensor 1, a strain gauge for detecting a pressure is piezoresistances (diffusion resistances) R1 to R4 diffused in the surface layer portion of the silicon substrate 2. Therefore, the strain gauge can be formed inside the silicon substrate 2 without projecting to the outside from the surface 21 of the silicon substrate 2. As a result, the structure of the pressure sensor 1 can be simplified, and further downsized.

The plurality of through-holes 6 are formed to have circular shapes with the same size in a plan view (that is, through-holes are columnar), and are arranged so as to be distributed regularly and uniformly in a square matrix all over the diaphragm 5. Therefore, even when aluminum filling bodies 8 different from the material (silicon) of the diaphragm 5 are filled in the through-holes 6, the centers of gravity of the aluminum filling bodies 8 are naturally distributed uniformly, so that the weights of the aluminum filling bodies 8 are applied uniformly to the entire diaphragm 5. Therefore, the center of gravity of the diaphragm 5 can be maintained at the center (intersection of diagonals) of the diaphragm 5 in a plan view. As a result, when a pressure is applied to the diaphragm 5, the diaphragm 5 can be entirely uniformly displaced.

The size of each through-hole 6 is 0.2 μm to 0.5 μm (preferably, 0.4 μm), so that by the sputtering method and reflow, aluminum can be easily embedded in the through-holes 6 to form the aluminum filling bodies 8.

Other various design variations are possible within the scope of the matters described in the claims.

For example, in the preferred embodiment described above, an example in which a pressure sensor 1 is formed in one silicon substrate 2 (silicon wafer 2) is described, however, the substrate that becomes a base for manufacturing the pressure sensor 1 may be, for example, an SOI (Silicon On Insulator) substrate or the like. In this case, the pressure sensor 1 can be formed in an active layer of the SOI substrate.

Further, the space to be hermetically closed as a reference pressure chamber is not necessarily flat in a direction parallel to the principal surface of the silicon substrate 2.

The filling bodies to be filled in the through-holes 6 for hermetically closing the flat space 4 are not limited to the aluminum filling bodies 8, and may be, for example, tungsten (W) filling bodies or silicon oxide ($SiO_2$) filling bodies.

In the preferred embodiment described above, all exposure spaces 29 adjacent to each other are integrated by anisotropic RIE, however, they may be integrated by action of an etchant by supplying the etchant into the exposure spaces 29 of the columnar recesses 28.

In the preferred embodiment described above, the aluminum filling bodies 8 are formed by thermally expanding an aluminum coating film 30 by reflow (refer to FIG. 5M) after the aluminum coating film 30 covering the entire surface of the protective thin film 7 is formed by the sputtering method (refer to FIG. 5L), however, it can also be formed by filling aluminum in the through-holes 6 by, for example, the CVD method. In this case, the flat space 4 can be hermetically closed by one step of filling by the CVD method, so that the manufacturing process of the pressure sensor 1 can be further simplified, and the manufacturing efficiency can be improved.

A preferred embodiment of the present invention is described in detail above, however, it is just a detailed example used for clarifying the technical contents of the present invention, and the present invention should not be interpreted as being limited to the detailed example, and the spirit and scope of the present invention are limited only by the accompanying claims.

The present application corresponds to: Japanese Patent Application No. 2010-54496 filed in Japan Patent Office on Mar. 11, 2010, whole disclosure of which is incorporated herein by reference.

What is claimed is:

1. A pressure sensor comprising:
a semiconductor substrate inside of which a reference pressure chamber is formed;
a closing body filled in a through-hole formed in the semiconductor substrate such that the closing body penetrates through a portion between the surface of the semiconductor substrate and the reference pressure chamber, and hermetically closes the reference pressure chamber;
a strain gauge provided inside of the semiconductor substrate between the surface of the semiconductor substrate and the reference pressure chamber; and
a surface insulating film coating the surface of the semiconductor substrate such that the strain gauge is not exposed to the surface of the semiconductor substrate;
wherein when the semiconductor substrate strains and deforms, the strain gauge strains to change the electric resistance thereof by strain deformation of the semiconductor substrate.

2. The pressure sensor according to claim 1, wherein the semiconductor substrate is made of silicon.

3. The pressure sensor according to claim 2, wherein the strain gauge includes piezoresistances formed by selectively doping the surface layer portion of the semiconductor substrate with an impurity.

4. The pressure sensor according to claim 1, wherein the inside of the reference pressure chamber is in a vacuum.

5. The pressure sensor according to claim 1, wherein the closing body is made of aluminum.

6. The pressure sensor according to claim 1, wherein the through-hole has a diameter of 0.2 μm to 0.5 μm.

7. The pressure sensor according to claim 1, wherein a protective film is interposed between a side surface of the through-hole and the closing body.

8. The pressure sensor according to claim 7, wherein the protective film is made of silicon oxide.

9. The pressure sensor according to claim 1, wherein a plurality of through-holes are formed.

10. The pressure sensor according to claim 9, wherein the plurality of through-holes are formed to have circular shapes with the same size in a plan view, and arranged so as to be distributed uniformly in a plan view.

11. The pressure sensor according to claim 1, wherein the area of the reference pressure chamber is larger than the total area of the regions occupied by the through-holes.

12. A method for manufacturing a pressure sensor comprising:
forming piezoresistances by selectively doping an impurity into the surface layer portion of a semiconductor substrate made of silicon;
forming a plurality of recesses dug into portions in the middle of the thickness direction from the surface of the semiconductor substrate in predetermined regions including the regions having the piezoresistances;
forming a protective film made of silicon oxide on inner surfaces of the plurality of recesses;
selectively removing the protective film from the bottom surfaces of the plurality of recesses;
forming a reference pressure chamber by digging the plurality of recesses by anisotropic etching and linking lower portions of the plurality of recesses to each other by isotropic etching; and
hermetically closing the reference pressure chamber by embedding closing bodies between the surface of the semiconductor substrate and the reference pressure chamber in the plurality of recesses; and
coating the surface of the semiconductor substrate with a surface insulating film so as not to expose the piezoresistances to the surface of the semiconductor substrate.

13. The method for manufacturing a pressure sensor according to claim 12, wherein embedding of the closing bodies is performed in a vacuum.

14. The method for manufacturing a pressure sensor according to claim 12, wherein the closing bodies are formed by coating aluminum on the inner surfaces of the recesses by the sputtering method and performing reflow.

15. The method for manufacturing a pressure sensor according to claim 12, wherein the closing body is formed by filling aluminum in the inner surfaces of the recesses by the CVD method.

16. A semiconductor device comprising:
a semiconductor substrate inside of which a space is formed; and
a through-hole penetrating between a surface of the semiconductor substrate and the space; wherein
the space is larger than the through-hole.

17. The semiconductor device according to claim 16 further comprising a closing body filled in the through-hole and hermetically closing the space.

18. The semiconductor device according to claim 16, wherein:
a plurality of through-holes are formed, and
the space is formed such that the space links lower ends of the plurality of through-holes.

19. The semiconductor device according to claim 16 further comprising a strain gauge provided inside of the semiconductor substrate between the surface of the semiconductor substrate and the space, wherein when the semiconductor substrate strains and deforms, the strain gauge strains to change the electric resistance thereof by strain deformation of the semiconductor substrate.

20. The semiconductor device according to claim 19, wherein the strain gauge includes piezoresistances formed by selectively doping the surface layer portion of the semiconductor substrate with an impurity.

21. The semiconductor device according to claim 17, wherein the closing body is made of aluminum.

* * * * *